(12) United States Patent
Takayanagi et al.

(10) Patent No.: US 7,388,183 B2
(45) Date of Patent: Jun. 17, 2008

(54) LOW DARK CURRENT PIXEL WITH A GUARD DRIVE ACTIVE PHOTODIODE

(75) Inventors: Isao Takayanagi, Tokyo (JP); Junichi Nakamura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 256 days.

(21) Appl. No.: 10/226,197

(22) Filed: Aug. 23, 2002

(65) Prior Publication Data

US 2004/0036009 A1 Feb. 26, 2004

(51) Int. Cl.
*H01L 27/00* (2006.01)
(52) U.S. Cl. .................. 250/208.1; 250/214 R
(58) Field of Classification Search ............ 250/214 R, 250/214 L, 214 A, 208.1; 348/300, 308
See application file for complete search history.

(56) References Cited

U.S. PATENT DOCUMENTS

| | | | | |
|---|---|---|---|---|
| 4,065,668 A | * | 12/1977 | Monticelli | ............... 250/214 P |
| 5,274,459 A | | 12/1993 | Hamasaki | |
| 5,656,806 A | * | 8/1997 | Dautriche | ............... 250/214 R |
| 5,953,060 A | * | 9/1999 | Dierickx | ..................... 348/241 |
| 6,031,217 A | * | 2/2000 | Aswell et al. | ............ 250/208.1 |
| 6,127,857 A | * | 10/2000 | Ogawa et al. | ................. 327/94 |
| 6,580,063 B1 | * | 6/2003 | Okamoto | ................ 250/208.1 |

FOREIGN PATENT DOCUMENTS

| | | |
|---|---|---|
| GB | 2 161 665 A | 1/1986 |
| WO | WO 00/19705 | 4/2000 |
| WO | WO 00/47021 | 8/2000 |

* cited by examiner

*Primary Examiner*—Thanh X. Luu
*Assistant Examiner*—Stephen Yam
(74) *Attorney, Agent, or Firm*—Dickstein Shapiro LLP

(57) ABSTRACT

A method and apparatus for reducing thermally generated dark current in a CMOS imaging device is disclosed. A photodiode within the imaging device is kept zero-biased, so that the voltage is equal at both ends of the photodiode. This zero-biasing is accomplished using several different techniques, including, alternatively: a transistor operating at its sub-threshold level; a leaky diode; a short-channel MOSFET; or ramping charge injection.

53 Claims, 14 Drawing Sheets

US 7,388,183 B2

LOW DARK CURRENT PIXEL WITH A GUARD DRIVE ACTIVE PHOTODIODE

FIELD OF THE INVENTION

The invention relates to a technique for suppressing unwanted thermal generation of current, and particularly to the suppression of thermally generated dark current in a pixel of an imaging device.

BACKGROUND OF THE INVENTION

Dark current refers to an undesired signal generated by a pixel of an imaging device even in the absence of a light signal. One source of dark current is thermally-generated energy. Thermally generated dark current in a CMOS active pixel imaging device presents problems in many imaging applications. For example, some automotive applications require stable pixel performance at temperatures ranging between 60 and 80 degrees Celsius. As temperature increases, dark current likewise increases. Additionally, some digital still cameras require increasingly longer integration times, which allows for higher sensitivity against photo current. However, the longer the integration time the higher the sensitivity to thermally generated dark current. Consequently, a need exists for a circuit which inhibits the generation of thermally generated dark current.

BRIEF SUMMARY OF THE INVENTION

In one aspect, the invention provides an imaging pixel having a photo conversion device for producing an electrical signal at a first node thereof in response to incident light energy; an electrical circuit for receiving the electrical signal at the first node and producing a pixel output signal therefrom; and a circuit path for providing the output signal to a second node of the photo conversion device. The circuit path produces a zero net bias across the photo conversion device to reduce generation of thermally induced dark current. In different embodiments, the electrical circuit may be a voltage follower circuit or a source follower circuit.

In another aspect, the invention provides a method of operating a pixel cell to provide a zero bias across a photo conversion device to reduce thermally induced dark current. These and other features and advantages of the invention will be better understood from the following detailed description which is provided in connection the accompanying drawings.

DETAILED DESCRIPTION OF THE INVENTION

Figure 1:
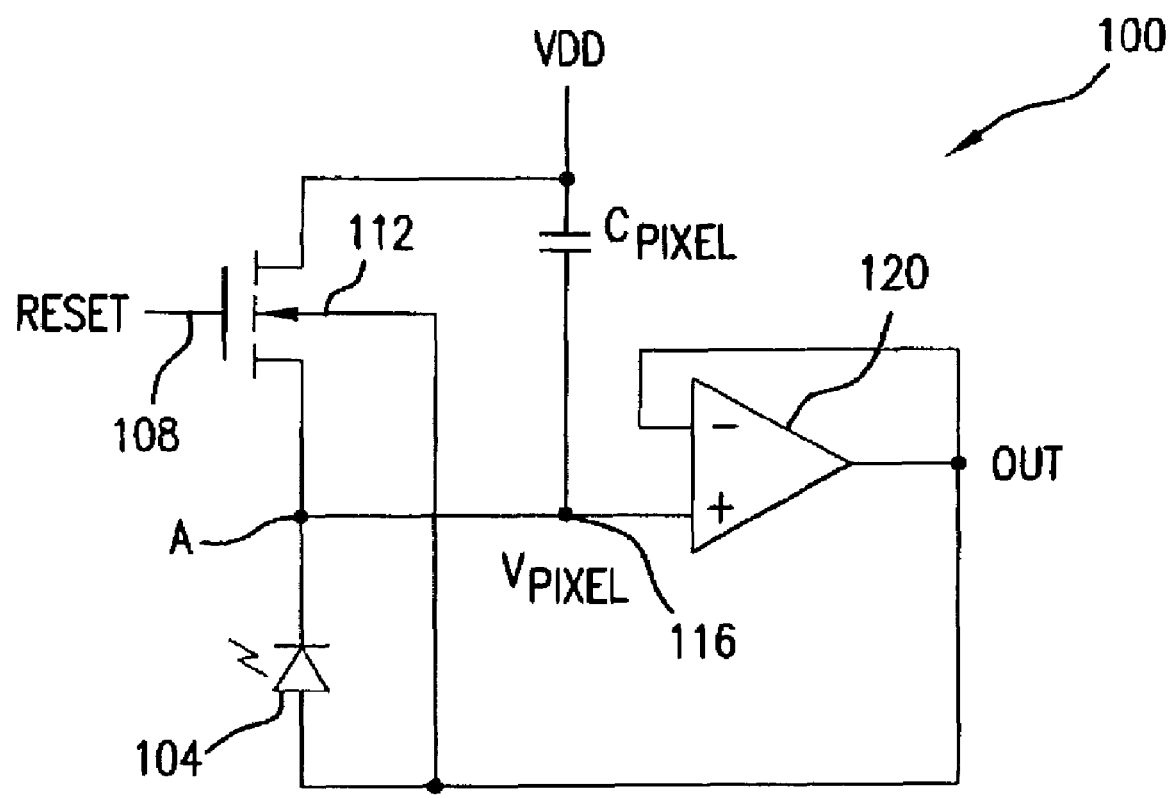
FIG. 1 is a schematic diagram of a first embodiment of the invention.

FIG. 1 illustrates a pixel cell 100 in accordance with a first embodiment of the invention which comprises a photodiode 104 having a charge accumulation node A connected to a reset switch transistor 108, the other side of which is connected to a potential source $V_{DD}$, a capacitor $C_{PIXEL}$ connected between node A and potential source $V_{DD}$, and an output circuit 120 configured as a voltage follower coupled to node A and providing a pixel output signal. The circuit 100 is an operational amplifier 120 having a positive input connected to node A and a negative input connected to the amplifier 120 output, which is also coupled to the side of the photodiode 104 opposite node A.

Within the reset transistor 108, the middle arrow signifies that a portion 112 of the transistor 108 between its source and drain (known as a bulk substrate) has an electrical connection wired thereto. In the pixel 100 the bulk substrate 112 is driven by the differential amplifier 120 following the $V_{PIXEL}$ at the node 116. Unwanted thermal current is reduced by biasing zero volts across the photodiode 104. Although the capacitor $C_{PIXEL}$ is shown connected to $V_{DD}$, it could also be connected to ground or a voltage source other than $V_{DD}$. Since the applied voltage across the photodiode 104 is always kept at zero volts by the differential amplifier 120, the capacitance at the photodiode 104 does not contribute to the charge conversion gain. Therefore, the conversion gain of the FIG. 1 circuit is largely determined by the value of $C_{PIXEL}$.

The circuit of FIG. 1 operates as follows. The node A pixel voltage $V_{PIXEL}$ is initialized to a reset voltage through the reset transistor 108, and this value is selectively read from the OUT node of the amplifier 120 to a sample and hold circuit. After reset, the photodiode 104 produces an integrated charge signal at node A which is stored on the capacitor $C_{PIXEL}$. This too is selectively read out to a sample and hold circuit.

The junction bias of the photodiode 104 is kept at zero during the reset and charge integration periods by the output of the voltage follower amplifier 120, which is coupled to the backside of the photodiode 104, that is, the side opposite node A. Because the junction of the photodiode 104 is zero-biased, there is no net current flow through the photodiode 104 to generate dark current. Moreover, the substrate of the reset transistor 108 also receives the output of the amplifier 120.

In this way, all junctions connected to the integration node A of FIG. 1 are zero biased, so that thermal leakage is thereby suppressed. Additionally, high conversion gain and therefore high sensitivity are achieved because they are determined solely by the gain capacitor $C_{PIXEL}$.

Figure 2:
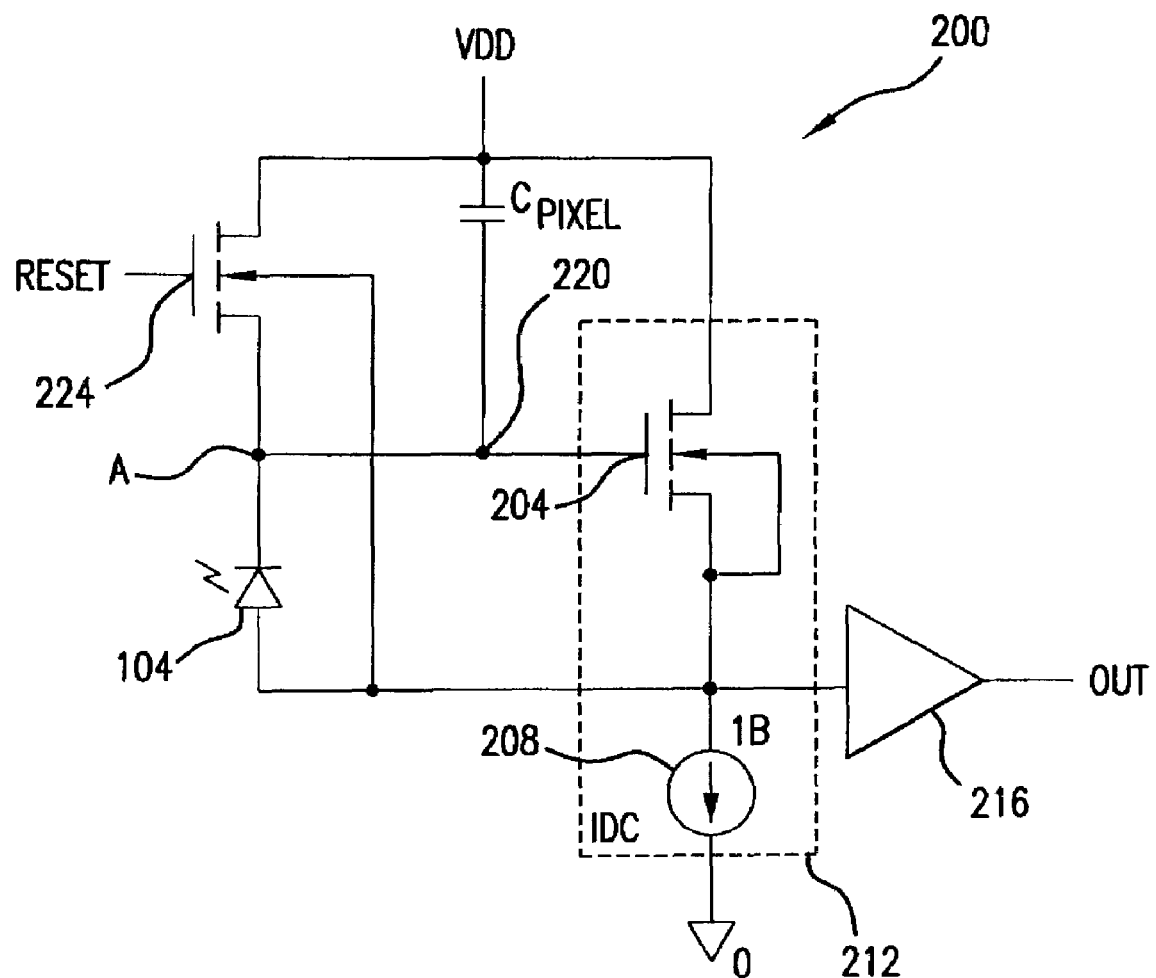
FIG. 2 is a schematic diagram of a second embodiment of the invention.

A second embodiment of the present invention is shown in FIG. 2, in which a source follower circuit 212 is used in place of the voltage follower circuit 120 of FIG. 1. The source follower circuit 212 includes a zero-threshold transistor 204 connected to a current source 208 and has a gate connected to node A. The pixel 200 differs from the pixel 100 in that that a buffer amplifier 216 is provided which does not have its output wrapped around and tied to the back side of the photodiode 104. However, the voltage across the photodiode 104 is still kept at zero, this time by the source follower circuit 212 which has an output coupled to the back side of the photodiode 104 and to the input of the buffer amplifier 216. The zero-threshold transistor 204 has a threshold voltage of zero, so that the source follower circuit 200 always provides output voltage to the back side of the photodiode 104 corresponding to the input voltage at the node 220. The transistor is held at a zero-threshold by controlling the impurity concentration beneath the gate of the transistor 204, which is also known as gate implantation. The source of the transistor 204 is connected to that transistor's bulk substrate, so that a "body effect" is eliminated and good linearity with unity gain is held in the source follower circuit 212. Consequently, the source follower circuit 212 can always keep zero-biasing across the photodiode 104 independent of any charge-accumulation condition.

Figure 3:
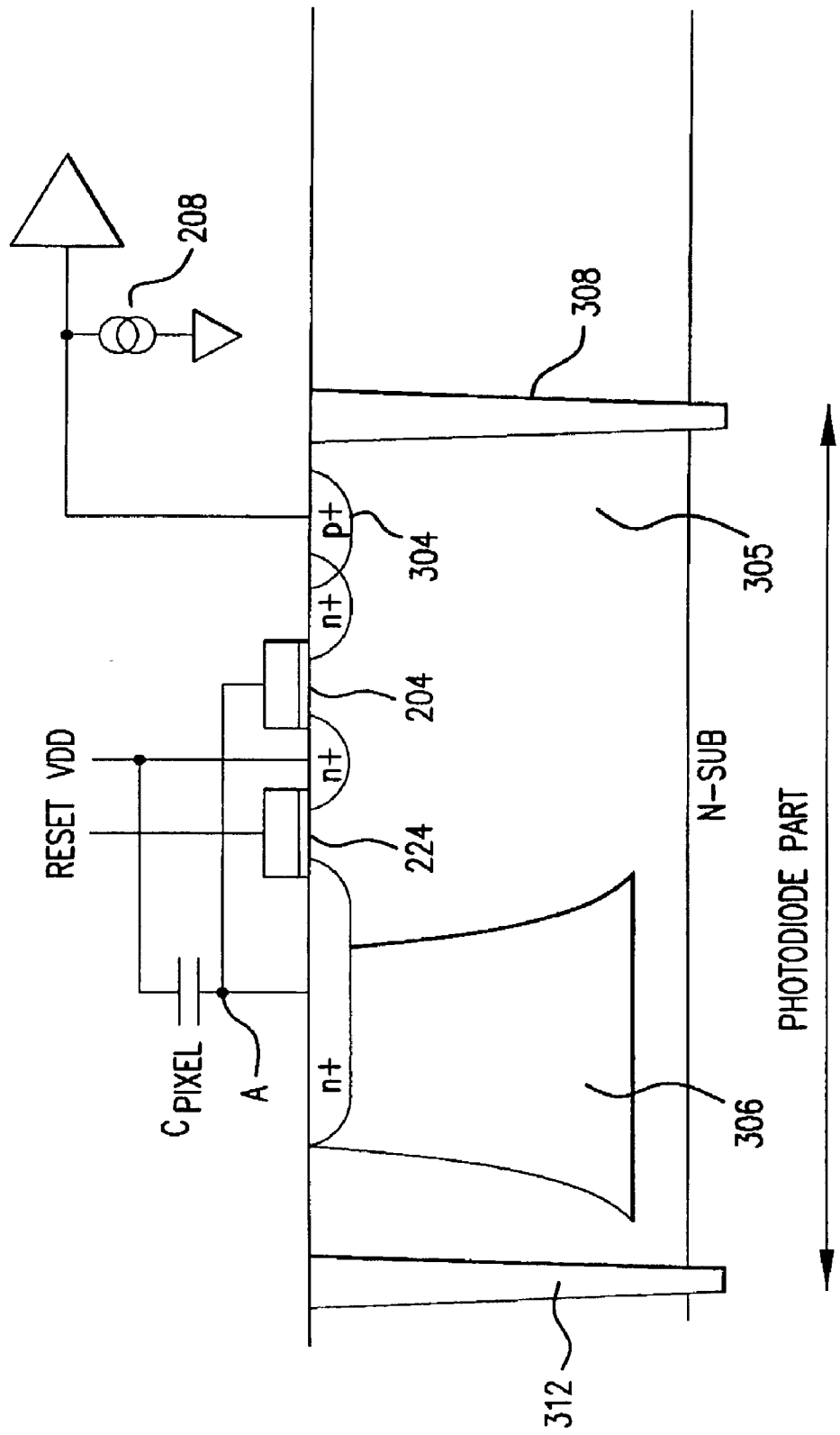
FIG. 3 is a cross sectional view of the photodiode shown in FIGS. 1 and 2.

FIG. 3 shows a schematic cross section of the pixel 200 in a semiconductor substrate. As shown in FIG. 3, the photodiode N+ charge collection region as well as the gate of the transistor 204 and the drain of transistor 224 are connected to the integration node A. In addition, the drain of the transistor 204 provides both an output to the buffer amplifier 216 and is also connected to the P well 305 by a P+ region 304 provided in the P well 305. The P well 305 forms the back side of the photodiode 104. The P well 305 is formed on the N-type substrate. In order to improve sensitivity of the photodiode 104 under zero biasing across the photodiode 104, the dopant concentration beneath the photodiode N+ charge collection region is partially decreased, so that generated electrons in the low concentration region 306 are gathered into the N+ charge collection region by a carrier diffusion process.

The arrangements of FIGS. 2 and 3 provide high dynamic range and excellent linearity. Although FIG. 3 shows trench isolation regions 308 and 312 (also known as STI regions), other isolation techniques could also be used such as nwell isolation or LOCOS. The trench isolation (STI) regions 308 and 312 are formed by etching out a trench and filling it with an insulator such as an oxide, which assists in isolating each individual pixel. To the right of the transistor 204, the n+ drain region and the p+ well control region 304 are overlapped. The P well region 305 in which the photodiode 104 is located is driven by the source follower circuit 212, following signal integration on the capacitor $C_{PIXEL}$. In this way, the well region 304 acts as a guard of the photodiode and is driven by the voltage follower amplifier 120, hence the term "guard drive" photodiode.

Figure 4:
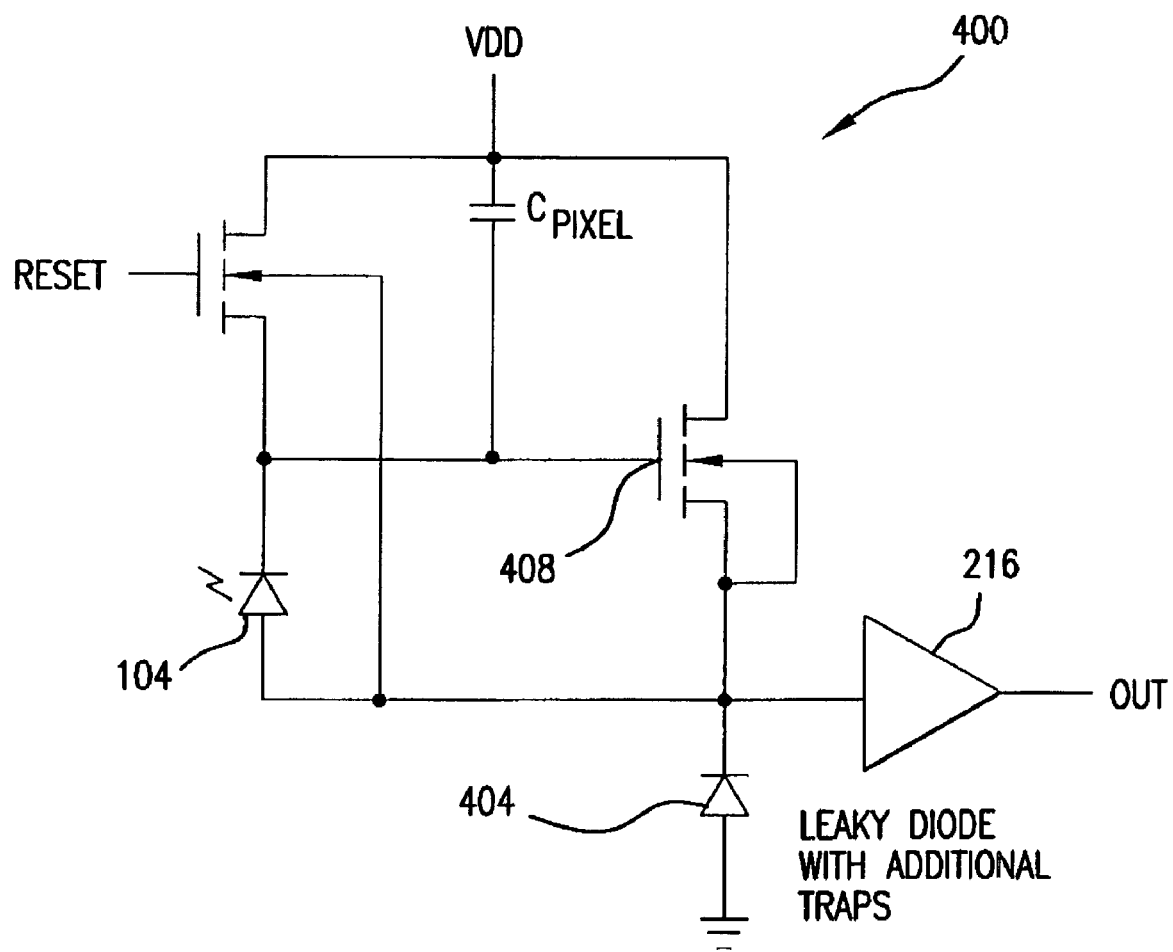
FIG. 4 is a schematic diagram of a third embodiment of the invention.
Figure 4A:
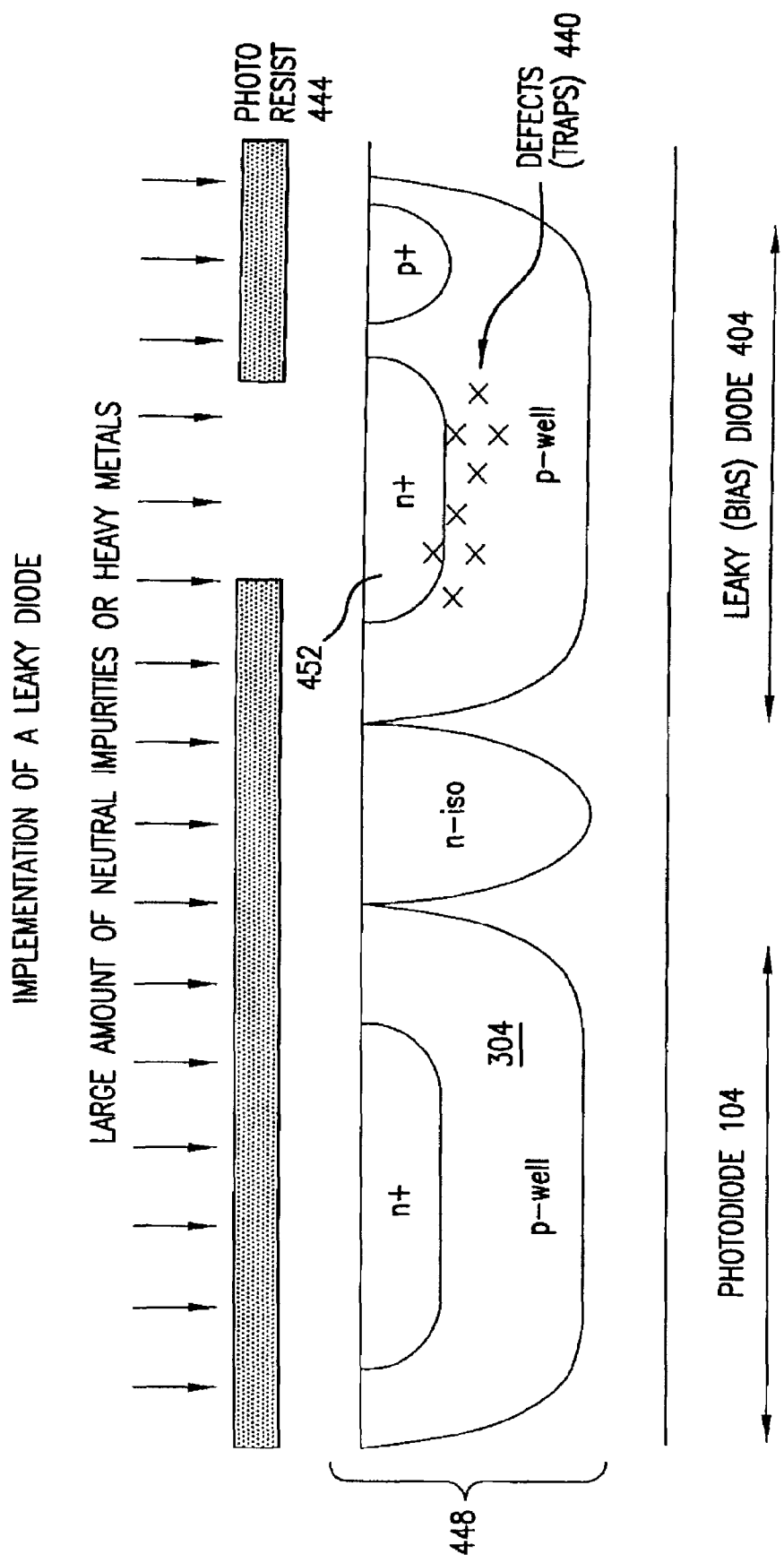
FIG. 4A is a schematic diagram of the leaky diode of FIG. 4.

It is desired to keep the current flow through the current source 208 as small as possible to minimize image power consumption, as one current source 208 is needed for each individual pixel. Thus, for an array of one million pixels, an overall current consumption of 1 mA would require that the current be less than 1 nA/pixel. Therefore, an equivalent resistance of several GΩ is needed. However, it is difficult to achieve such high levels of resistance with conventional resistor materials such as diffusion layers or polysilicon layers. To address the above problems, FIG. 4 shows a pixel circuit 400 having a current source in the form of a leaky diode 404. The trap density of the diode 404 can be increased by increasing the amount of neutral impurities or traps 440 contained within the junction of the diode 404 during fabrication, which in turn affects the reverse-biased current flowing therethrough, as shown in FIG. 4A. Because of the very low amount of reverse-biased current, the transistor 408 is operated in its sub-threshold mode, in which the threshold voltage $V_{TH}$ (or $V_{GS}$) decreases with increasing temperature. The source follower transistor 408, like the transistor 204 (FIG. 2), is described as a zero-threshold transistor when in actuality its threshold voltage is merely very low. Because the leakage current of the diode 404 increases with increasing temperature, this has the effect of offsetting the temperature dependence of the zero-threshold transistor 408.

A more detailed view of the leaky diode 404 is shown in FIG. 4A, where all portions of a substrate 448 except an n+ region 452 are covered by a photo resist 444 and then implanted with a large amount of neutral impurities or heavy metals. This implantation gives rise to a controllable amount of defects or traps 440 in the diode 404, which has the effect of allowing a quantifiable amount of leakage current. This controllable leakage current is used with the output of the source follower transistor 408 to zero-bias the photodiode 104.

Figure 5:
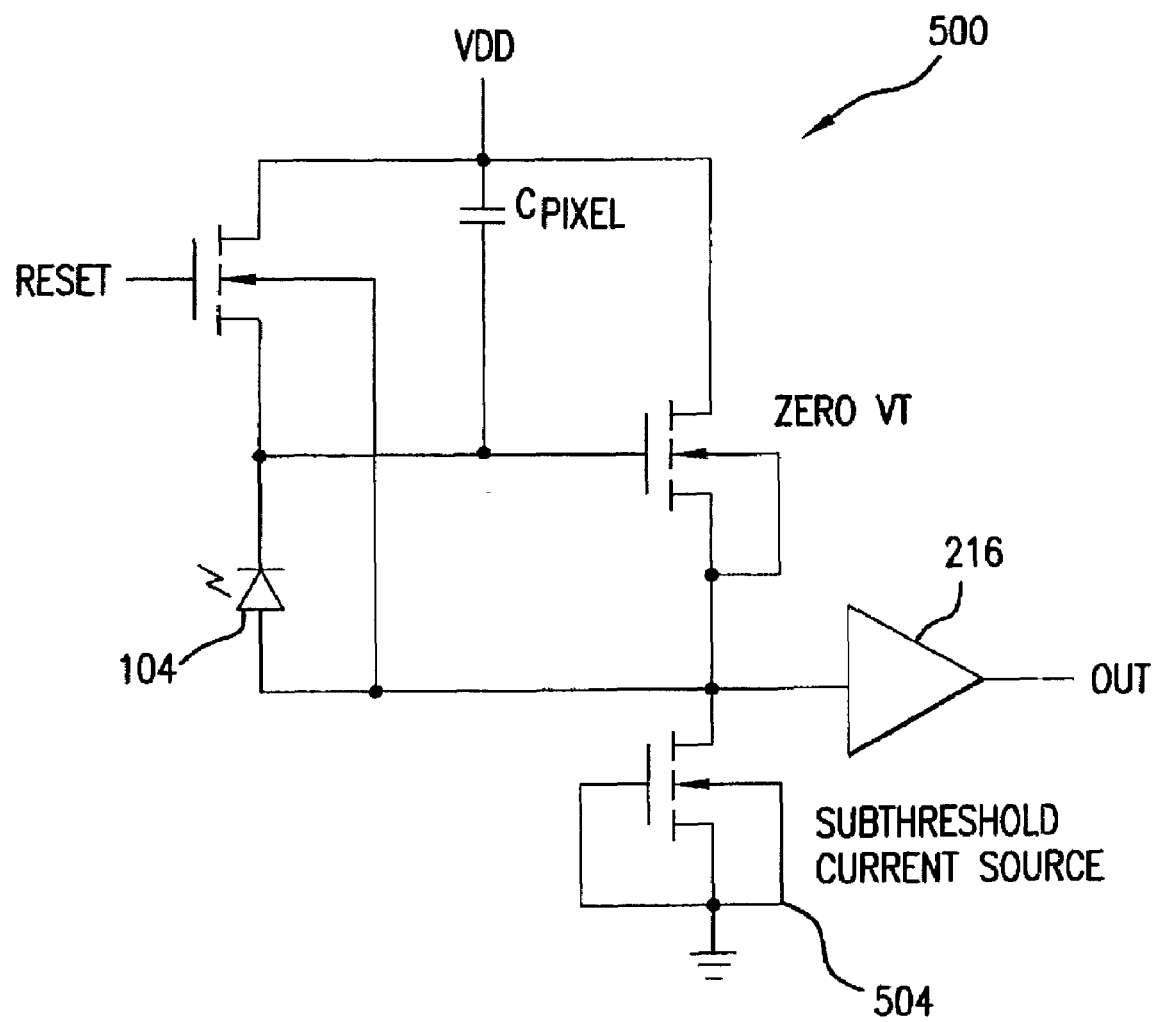
FIG. 5 is a schematic diagram of a fourth embodiment of the invention.

Another way of generating current for the purpose of maintaining the photodiode 104 at a zero bias is shown in FIG. 5, where a subthreshold current source 504 is used within the pixel circuit 500. The subthreshold current source 504 employs a gate-grounded short channel MOSFET transistor. Such a transistor is superior to the zero-threshold transistor 408 of FIG. 4 in that the transistor 408 is always subject to a small amount of channel current, in the range of several pA to several nA. This is true even when $V_{GS}$ is zero. Conversely, the gate-grounded short channel transistor 504 is not subject to unwanted channel current. As with the pixel 400, this stability has the effect of offsetting the temperature dependence of the photodiode 104. Although the pixel 500 does not require special process steps, it does require an additional transistor 504.

Figure 6:
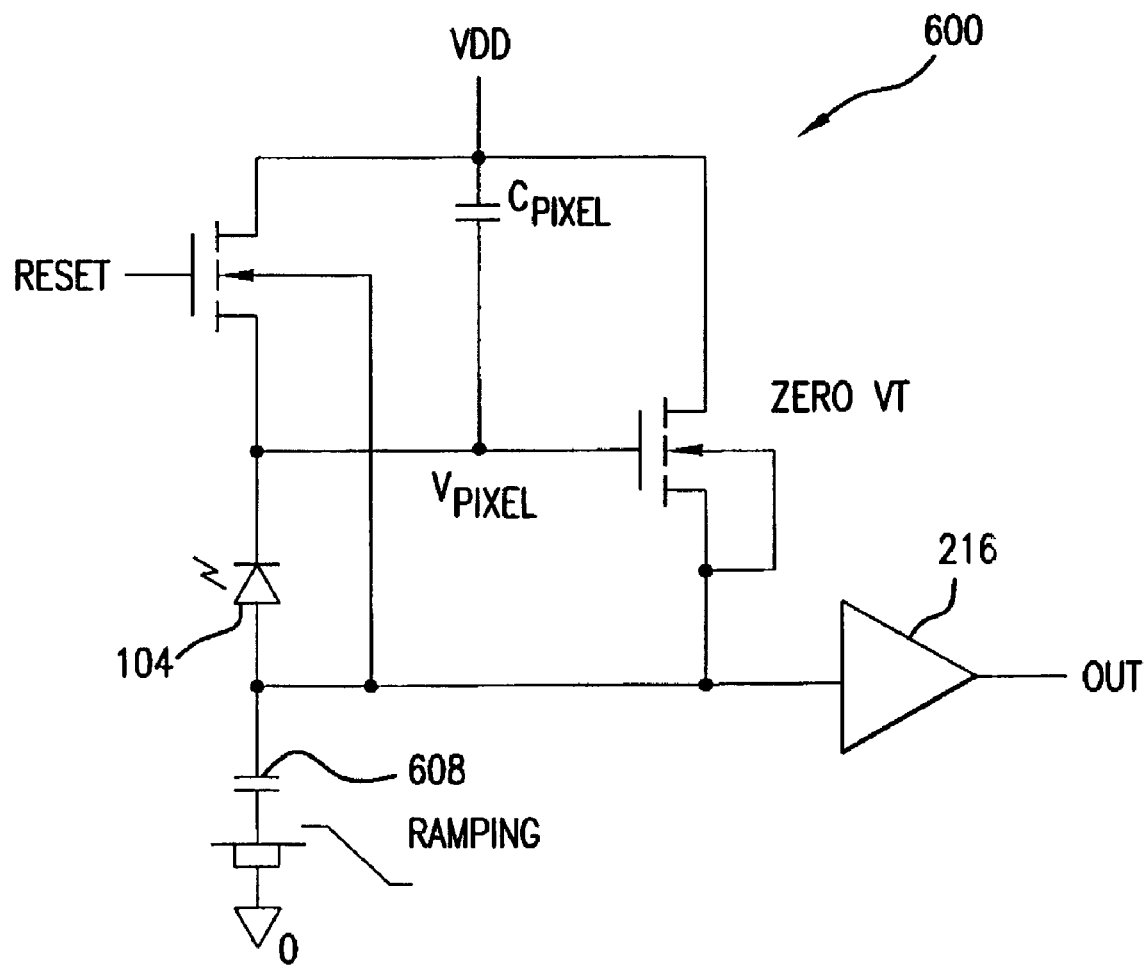
FIG. 6 is a schematic diagram of a fifth embodiment of the invention.

FIG. 6 shows a pixel circuit 600 which uses an approach that differs from the pixels 400 and 500 in that it uses ramping charge injection rather than current sources 404 and 504 to zero-bias the photodiode 104. After a reset operation, a negative-slope ramping pulse is applied to a capacitor 608, which is attached to the guard node (backside) of the photodiode 104. The ramping pulse generates a bias current which can be expressed as $$I_{BIAS} = C_{BIAS} \times dv/dt \quad (1)$$

Recent advances in CMOS capacitor fabrication techniques have increased uniformity reproducibility of capacitor yields. This in turn increases the accuracy of the bias current control of the pixel 600.

Figure 7:
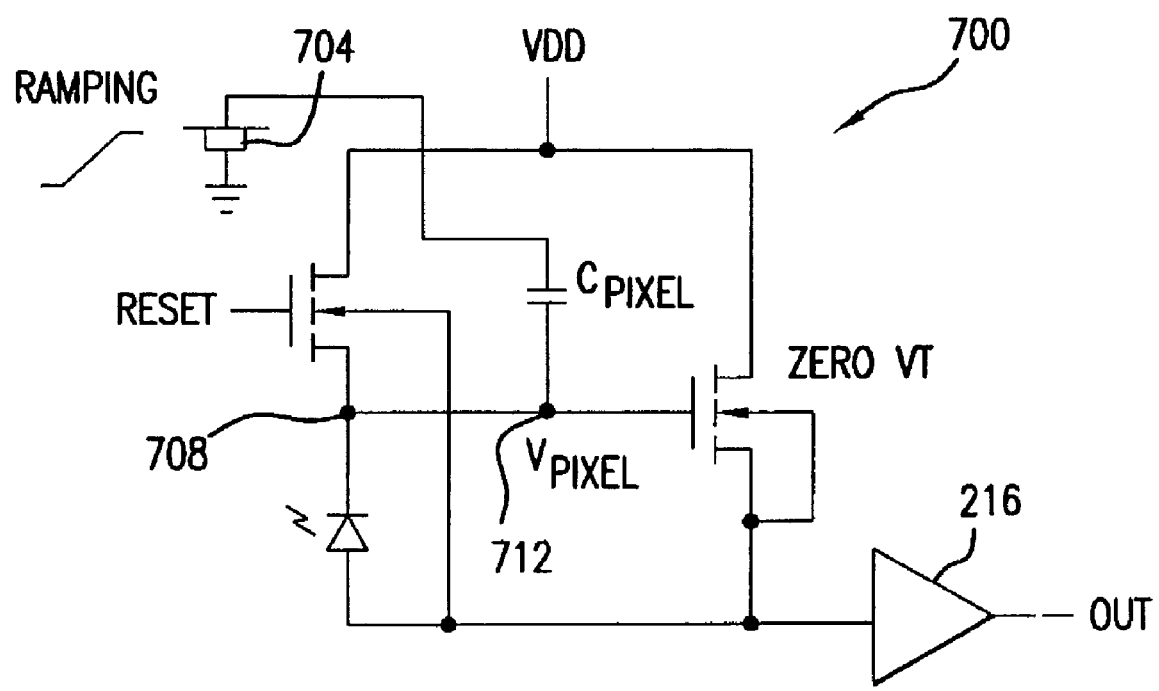
FIG. 7 is a schematic diagram of a sixth embodiment of the invention.

FIG. 7 shows another pixel 700 which generates bias current using a ramping technique. Here the upper electrode of the capacitor $C_{PIXEL}$ is connected to a ramping pulse generator 704 instead of $V_{DD}$ as in the prior embodiments. The other side of the ramping pulse generator 704 is applied to the substrate ground. A positive-slope ramping pulse 716 is applied to the capacitor $C_{PIXEL}$ during the integration period. Due to this current being injected through $C_{PIXEL}$, the voltage at the integration node 712 (and hence the guard node 708) increases with time. The ramping pulse generates a bias current which can be expressed as $$I_{BIAS} = C_{WELL\_SUB} \times dv/dt \quad (2)$$

where $C_{WELL\_SUB}$ and dv/dt denote a capacitance between the guard node 708 and substrate and the slope of the applied ramping pulse 716, respectively. Because the positive slope ramping charge 716 is applied directly to the substrate, no additional capacitor is needed.

Figure 8:
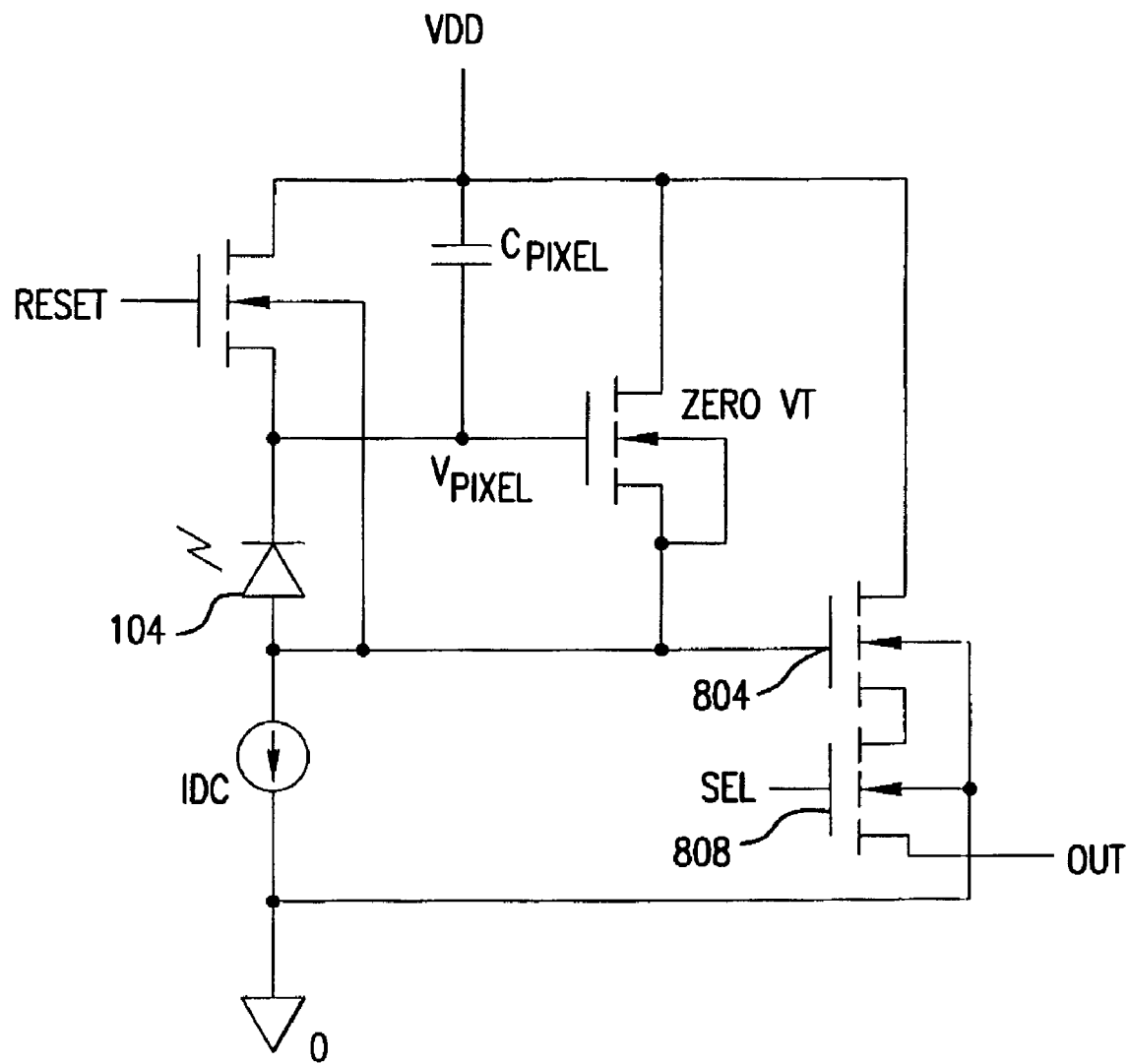
FIG. 8 is a schematic diagram of an NMOS implementation of the read-out portion of the invention.
Figure 9:
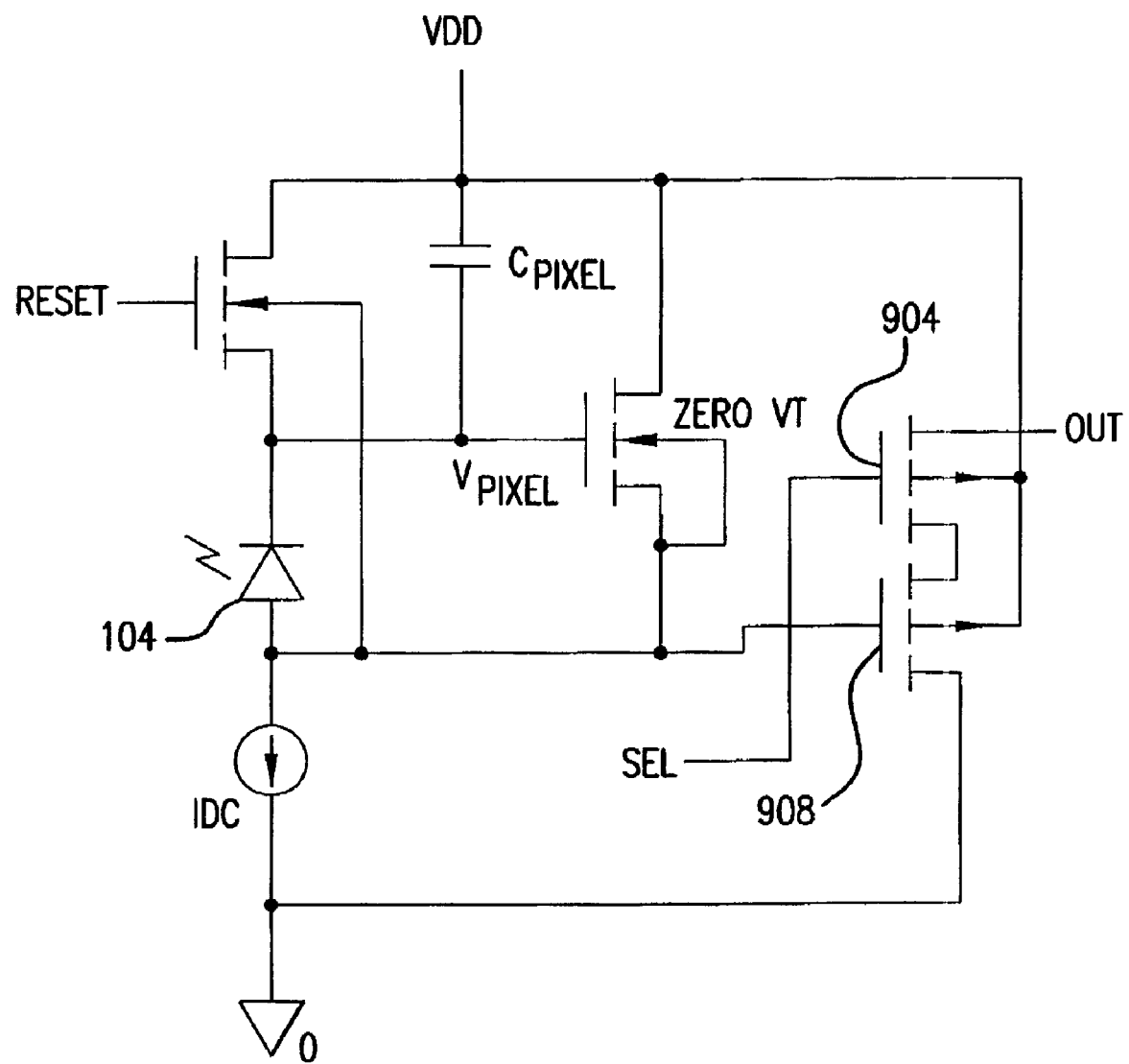
FIG. 9 is a schematic diagram of a PMOS implementation of the read-out portion of the invention.

To read out the signals integrated in the photodiode 104, it is necessary to implement a pixel selector into the amplifier 216 shown in prior embodiments. In FIGS. 8 and 9, NMOS and PMOS source followers 804, 904 and selection transistors 808, 908 are used to select and read out the pixel signal. The source followers 804, 904 are located in a different well region from the photodiode 104 so that they don't affect the photodiode characteristics, which reduces noise from the readout components. Because the source followers 804, 904 act as a voltage buffer, there is no longer any need for a separate buffer amplifier 216.

Figure 10:
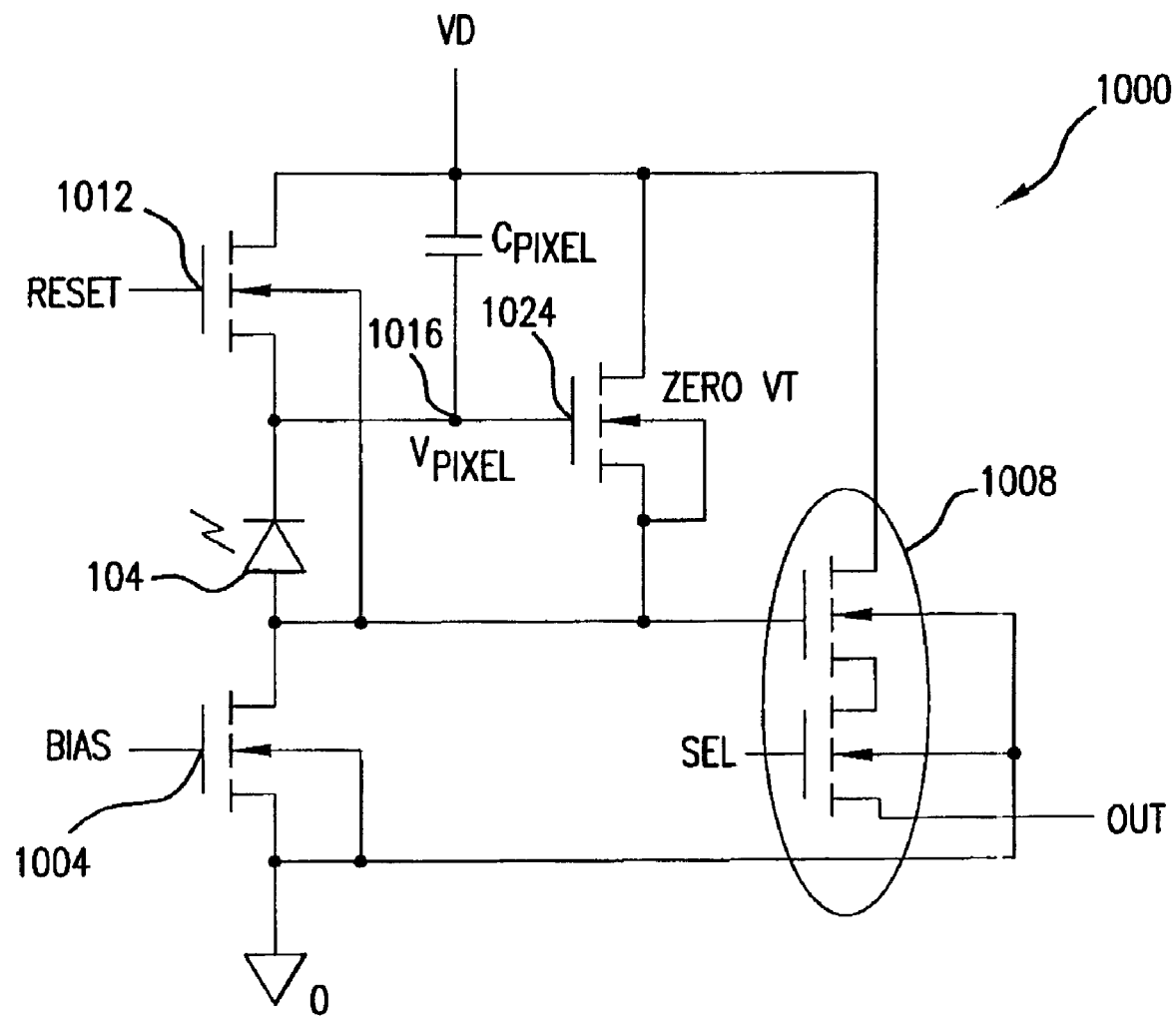
FIG. 10 is a schematic diagram of a seventh embodiment of the invention.

FIG. 10 shows a pixel 1000 which utilizes the subthreshold bias current source 1004 similar to that shown in FIG. 5 in combination with an NMOS readout circuit 1008 similar to that shown in FIG. 8. Because the source follower transistors within the NMOS readout circuit 1008 act as a voltage buffer, there is no need for a buffer amplifier.

Figure 11:
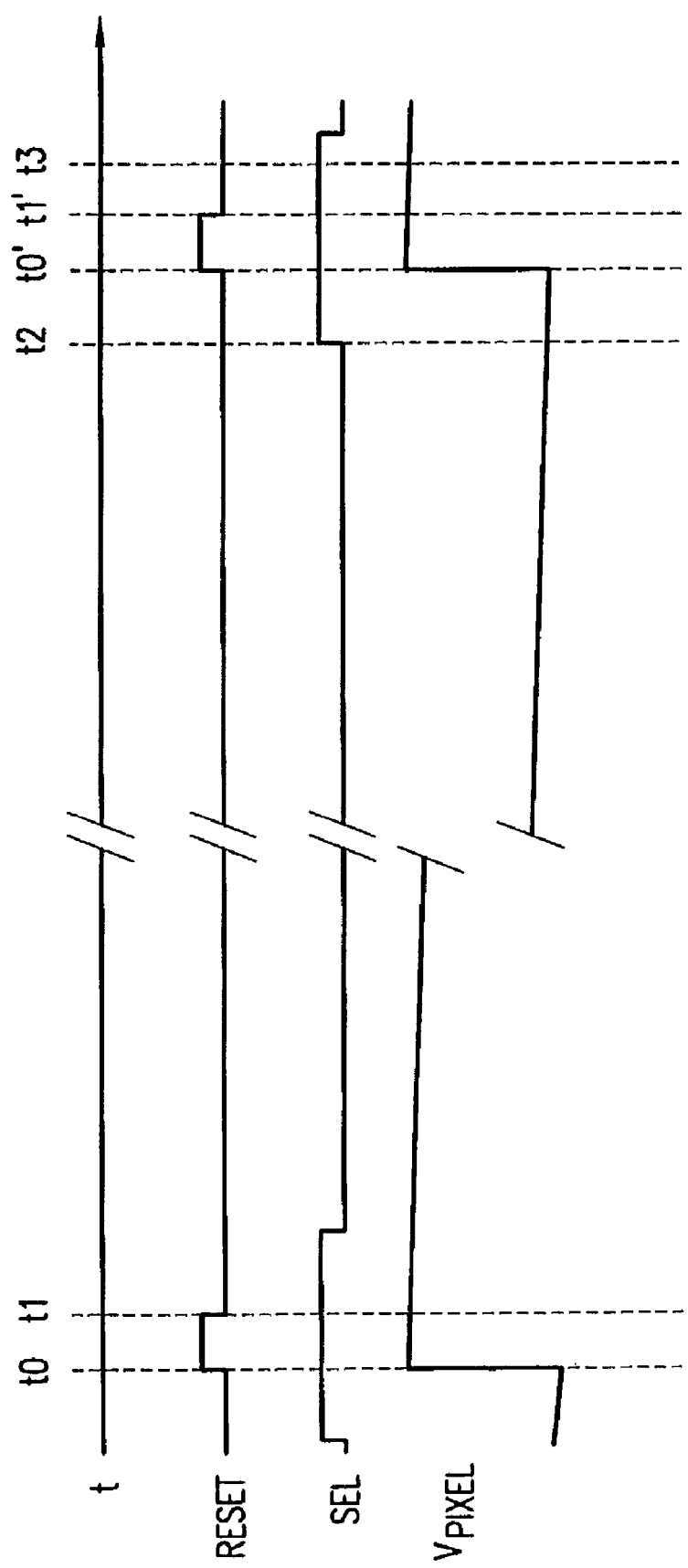
FIG. 11 is a timing diagram of the circuit of FIG. 10.

The sequence of operation of the pixel 1000, as well as all of the pixel embodiments of the present invention, can be divided into three basic periods: reset, integration, and readout. FIG. 11 shows the timing of the circuit of FIG. 10. At t=t0, the pixel is reset, thereby applying a reset pulse to the reset transistor 1012, while the subthreshold transistor 1004 generates a constant bias current with a constant gate bias. Supposing the high level of the reset pulse is at a voltage $V_D$, the voltage $V_{PIXEL}$ at the integration node 1016 and also at the guard well of the photodiode 104 can then described as follows:

$$V_{PIXEL} = V_D - V_{THRESHOLD\_1004} \quad (3)$$

The reset voltage on the photodiode 104 is read out through the transistor 1024 and read out circuit 1008 by application of a selection signal SEL to the read out circuit 1008. At t=t1, the signal integration process is begun. The voltage of the guard well of the photodiode 104 decreases as $V_{PIXEL}$ decreases, thus maintaining a zero bias condition between $V_{PIXEL}$ and the guard well. Following the integration period, at t=t2 another select pulse is applied to the readout circuit 1008, where the output voltage is then read at the OUT node. In order to achieve correlated double sampling, an offset signal is readout again at the next reset period t=t3. Subtracting the offset signal from the prior readout signal suppresses both the offset variations of the pixel and noise of the readout circuit. Thus, a low noise readout image can be obtained.

Figure 12:
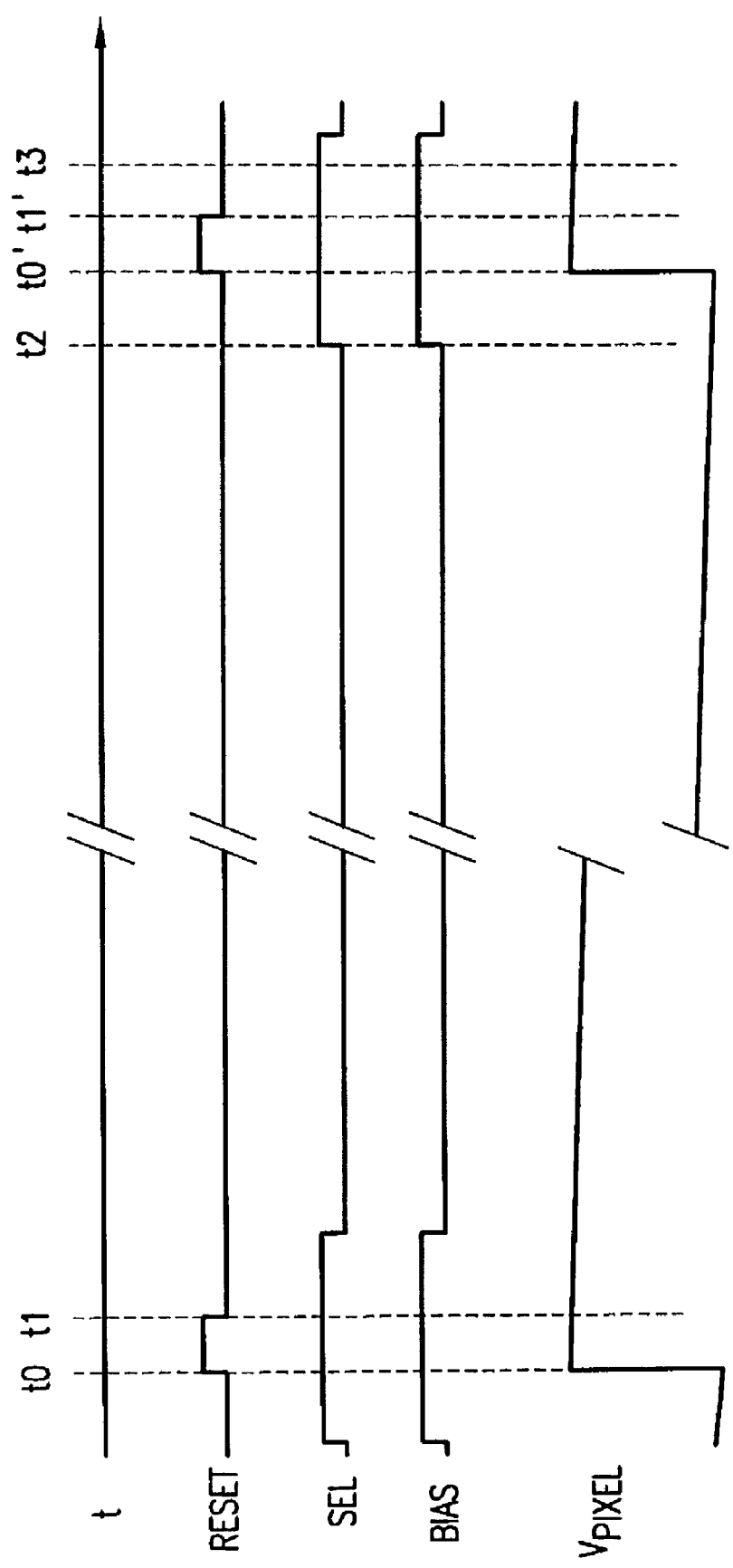
FIG. 12 is an enhanced timing diagram of the circuit of FIG. 10.

To reduce power the consumption of the circuit 1000, the bias current passing through the transistor 1004 is kept as small as possible. However, doing so has the effect of reducing the speed of the guard drive operation and increasing the duration of the reset period. To minimize these effects, a pulse is applied to the gate of the transistor 1004, as shown by the BIAS line in FIG. 12.

Figure 13:
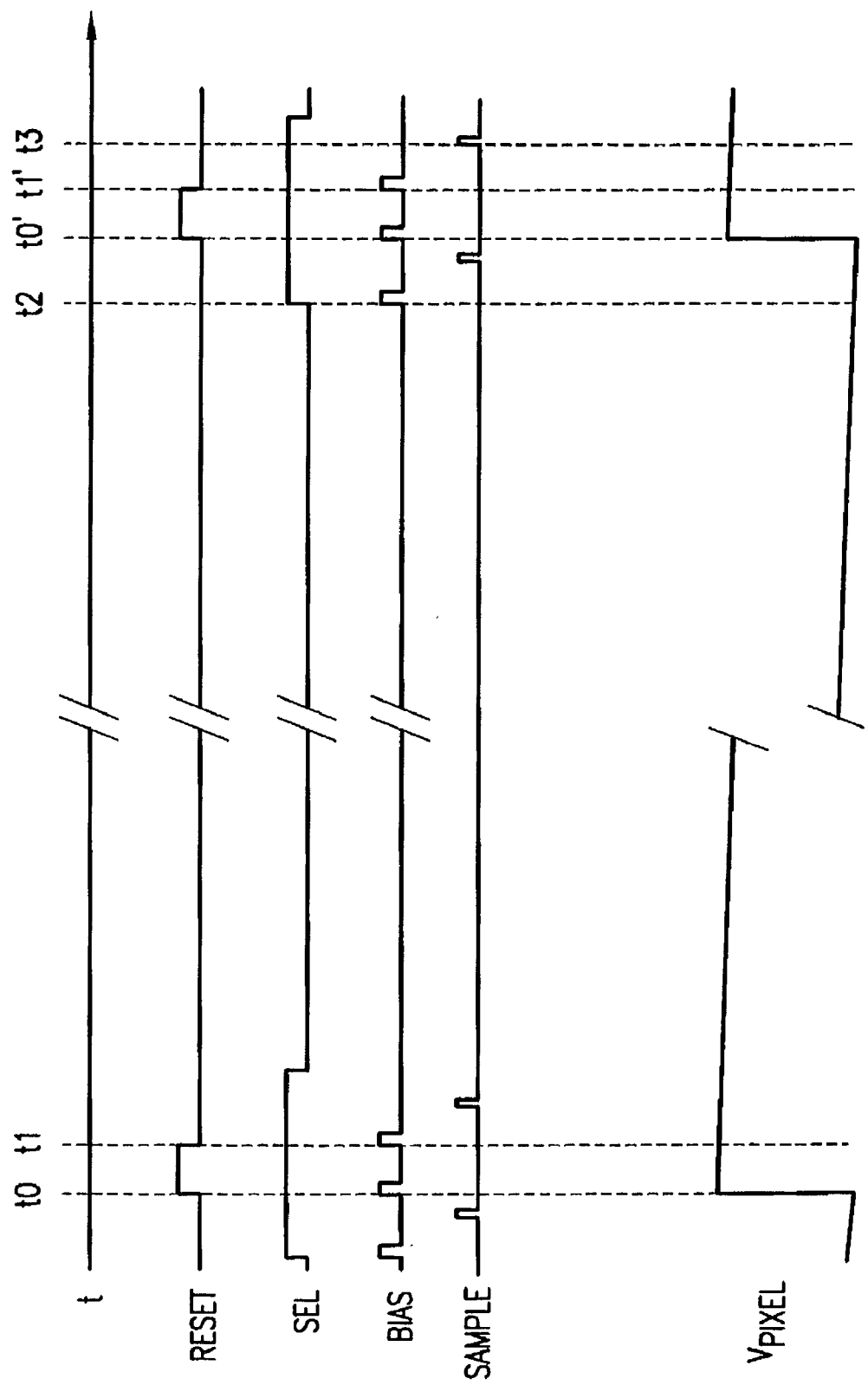
FIG. 13 is a further enhanced timing diagram of the circuit of FIG. 10.

To improve readout and reset speed, a transient bias current can be used at the beginning of every readout and reset operation. As shown in FIG. 13, at t=t2, t=t0', and t=t1', a short pulse is applied to the gate of the bias transistor 1004 as shown by the BIAS line, so that the voltage of the guard well is reduced by the pulse. After this pulse transitions low, the zero threshold transistor 1024 drives the guard well 304 of the photodiode 104 so that the voltage of the guard well 304 increases transiently so as to be close to VPIXEL. Sampling the pixel output with an identical waiting time, as shown by the line SAMPLE in FIG. 13, results in an output signal with good reproducibility. One advantage of such operation is that lower power consumption is achieved than the bias current modulation methods of FIGS. 1-9 because of the short pulse width of the bias pulse. This difference is readily apparent by contrasting the pulse width on the BIAS lines of FIG. 12 with that shown in FIG. 13.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. An imaging pixel comprising:
    a photo conversion device for producing an electrical signal from an incident image at a first node thereof in response to incident light energy and for performing a photo conversion operation during a charge integration period;
    an electrical circuit for receiving said electrical signal at said first node and producing an imaging pixel output signal;
    a circuit path for providing a signal representative of said imaging pixel output signal to a second node of said photo conversion device; and
    a reset switch for resetting said first node to a predetermined voltage prior to a charge integration period by being substantially zero biased by said imaging pixel output signal.

2. An imaging pixel as in claim 1 wherein said circuit path causes a junction of said photo conversion device to have a substantially zero biasing there across.

3. An imaging pixel as in claim 2 wherein said electrical circuit is one of a voltage follower circuit and a source follower circuit.

4. An imaging pixel as in claim 3 wherein said photo conversion device further comprises
    a capacitor having a terminal coupled to said first node for use with said electrical circuit in integrating said electrical signal.

5. An imaging pixel as in claim 4 wherein said reset switch couples a first voltage potential to said first node, and wherein said capacitor is connected between said first voltage potential and said first node.

6. An imaging pixel as in claim 1 wherein said reset switch is a transistor.

7. An imaging pixel as in claim 6 wherein said transistor has a substrate biased by said imaging pixel output signal.

8. An imaging pixel as in claim 5 wherein said first voltage potential is a positive voltage potential.

9. An imaging pixel as in claim 4 wherein said source follower circuit and said capacitor provide a conversion gain for charge flow produced by said photo conversion device during said integration period which is substantially determined by the value of said capacitor.

10. An imaging pixel as in claim 3 wherein said electrical circuit is a voltage follower circuit.

11. An imaging pixel as in claim 3 wherein said electrical circuit is a source follower circuit.

12. An imaging pixel as in claim 4 further comprising a positive slope ramp pulse generator for supplying a ramping current to another terminal of said capacitor.

13. An imaging pixel as in claim 12 wherein said electrical circuit is a source follower circuit.

14. An imaging pixel as in claim 13 wherein said source follower circuit comprises:
    a transistor having a gate for receiving said electrical signal from said first node, a first source/drain region coupled to a first voltage potential and a second source/drain region providing said imaging pixel output signal.

15. An imaging pixel as in claim 14 wherein said transistor has a substrate biased by said imaging pixel output signal.

16. An imaging pixel as in claim 15 wherein a reset switch couples a first voltage potential to said first node.

17. An imaging pixel as in claim 16 wherein said reset switch is another transistor.

18. An imaging pixel as in claim 16 wherein said another transistor has a substrate biased by said imaging pixel output signal.

19. An imaging pixel as in claim 1 wherein said photo conversion device is a photodiode.

20. An imaging pixel as in claim 1 further comprising a read out circuit for reading and selectively outputting said imaging pixel output signal.

21. An imaging pixel as in claim 20 wherein said read out circuit comprises:
an access transistor for receiving a signal representing said imaging pixel output signal and selectively providing said received signal as said imaging pixel output signal.

22. An imaging pixel as in claim 21 wherein said read out circuit further comprises a source follower transistor for providing said signal representing said imaging pixel output signal to said access transistor.

23. An imaging pixel as in claim 21 wherein said access transistor and source follower transistors are n-type transistors having a substrate coupled to ground.

24. An imaging pixel as in claim 21 wherein said access transistor and source follower transistor are p-type transistors having a substrate coupled to a positive potential.

25. An imaging pixel comprising:
a photo conversion device for producing an electrical signal from an incident image at a first node thereof in response to incident light energy;
an electrical circuit for receiving said electrical signal at said first node and producing an imaging pixel output signal, wherein said electrical circuit is one of a voltage follower circuit and a source follower circuit;
a circuit path for providing a signal representative of said imaging pixel output signal to a second node of said photo conversion device wherein said photo conversion device performs a photo conversion operation during a charge integration period;
a transistor for resetting said first node to a predetermined voltage prior to said charge integration period, said transistor having a substrate biased by said imaging pixel output signal; and
a capacitor having a terminal coupled to said first node for use with said electrical circuit in integrating said electrical signal,
wherein a junction of said transistor which is connected to said first node is substantially zero biased by said imaging pixel output signal.

26. An imaging pixel comprising:
a photo conversion device for producing an electrical signal from an incident image at a first node thereof in response to incident light energy;
an electrical circuit for receiving said electrical signal at said first node and producing an imaging pixel output signal, wherein said electrical circuit is one of a voltage follower circuit and a source follower circuit;
a circuit path for providing a signal representative of said imaging pixel output signal to a second node of said photo conversion device wherein said photo conversion device performs a photo conversion operation during a charge integration period;
a transistor having a gate for receiving said electrical signal from said first node, a first source/drain region coupled to a first voltage potential and a second source/drain region providing said imaging pixel output signal; and
a current source coupled between said second node and a second voltage potential.

27. An imaging pixel as in claim 26 wherein said transistor has a substrate biased by said imaging pixel output signal.

28. An imaging pixel as in claim 26 wherein said current source is a leaky diode.

29. An imaging pixel as in claim 26 wherein said transistor operates in the subthreshold region.

30. An imaging pixel as in claim 26 wherein said current source is a transistor connected to operate as a subthreshold current source.

31. An imaging pixel as in claim 26 wherein said current source is a negative slope ramp pulse generator current source coupled to said second node through a bias capacitor.

32. An imaging pixel comprising:
a photodiode for providing an electrical signal from an incident image at a first signal node thereof in response to incident light energy and for performing a photo conversion operation during an integration period;
a capacitor having a terminal coupled to said first node for integrating said electrical signal during the integration period;
an output transistor arranged as one of a voltage follower and a source follower for enabling variation of a capacitance of said capacitor to tailor a conversion gain of said imaging pixel, said output transistor having a gate coupled to said first node for producing an imaging pixel output signal;
a circuit for providing said imaging pixel output signal to a second node of said photodiode such that said photodiode is substantially zero biased; and
a reset transistor for resetting said first node to a predetermined voltage potential outside said integration period.

33. An imaging pixel as in claim 32 wherein said output transistor is a first source follower transistor and a substrate of said first source follower transistor is biased by said imaging pixel output signal.

34. An imaging pixel as in claim 32 wherein a substrate of said reset transistor is biased by said imaging pixel output signal.

35. An imaging pixel as in claim 32 wherein said capacitor is connected between said first node and said predetermined voltage potential.

36. An imaging pixel as in claim 32 further comprising a read out circuit for receiving said imaging pixel output signal and selectively outputting said imaging pixel output signal.

37. An imaging pixel as in claim 36 wherein said read out circuit comprises an access transistor for receiving a signal representing said imaging pixel output signal and selectively providing said received signal as said imaging pixel output signal.

38. An imaging pixel as in claim 37 wherein said read out circuit further comprises a second source follower transistor for providing said imaging pixel output signal to said access transistor.

39. An imaging pixel as in claim 37 wherein said access transistor and source follower transistors are n-type transistors having a substrate coupled to ground.

40. An imaging pixel comprising:
a photodiode for providing an electrical signal from an incident image at a first signal node thereof in response to incident light energy;
a capacitor having a terminal coupled to said first node for integrating said electrical signal during an integration period;

an output transistor arranged as one of a voltage follower and a source follower, said output transistor having a gate coupled to said first node for producing an imaging pixel output signal;

a circuit for providing said imaging pixel output signal to a second node of said photodiode such that said photodiode is substantially zero biased;

a reset transistor for resetting said first node to a predetermined voltage potential outside said integration period; and a current source coupled to said second node of said photodiode for providing a bias current to said second node.

41. An imaging pixel as in claim 40 wherein said current source is a bias transistor having a first source/drain region connected to said second node, a second source/drain region connected to ground and a gate for receiving a bias control signal.

42. An imaging pixel as in claim 41 wherein said bias transistor has a substrate coupled to ground.

43. A method of operating an imaging pixel comprising:
setting a first node of a photo conversion device to a first voltage potential during a reset period;
integrating an electrical signal present at said first node and which is affected by light imaging on said photo conversion device during an integration period to produce an imaging pixel output signal;
providing said imaging pixel output signal to a second node of said photo conversion device to substantially equalize the voltages of the first and second nodes of said photo conversion device at least during said integration period; and
generating a bias current which affects said second node at least during said integration period.

44. A method as in claim 43 further comprising:
selectively reading out said imaging pixel output signal as a pixel output signal during a read out period.

45. A method as in claim 44 wherein said selectively reading out occurs after said integration period terminates.

46. A method as in claim 45 further comprising generating a pixel reset signal and subtracting said imaging pixel output signal from said reset signal.

47. A method as in claim 46 wherein said act of generating said pixel reset signal comprises:
setting said first node to said first voltage potential during a reset period;
producing a reset output signal from said first node;
applying said reset output signal to said second node of said photo conversion device; and
reading out said reset output signal as said pixel reset signal.

48. A method as in claim 45 further comprising increasing the value of said bias current following said reset period.

49. A method as in claim 43 wherein said bias current is a downward ramping bias current.

50. A method as in claim 43 wherein said bias current is a pulsed bias current.

51. An imaging pixel comprising:
a doped well of a first conductivity;
a first doped region of a second conductivity provided in said well to form a photo diode;
a second doped region of said second conductivity type formed in said well for receiving a voltage potential;
a third doped region of said second conductivity type formed in said well and spaced from said second doped region;
a first gate structure provided between said first and second doped regions for receiving a reset signal and resetting said first doped region by a potential applied to said second doped region;
a capacitor coupled between said potential and said first doped region;
a second gate structure provided between said second and third doped regions and electrically connected to said first doped region; and
an electrical path between said third doped region and a p-well for causing said photo diode to be zero biased.

52. An imaging pixel comprising:
a photo conversion device for producing an electrical signal at a first node thereof in response to incident light energy;
a current source connected to a second node of said photo conversion device, for maintaining a zero voltage bias across said photo conversion device;
an electrical circuit for receiving said electrical signal at said first node and producing an imaging pixel output signal; and
a circuit path for providing said imaging pixel output signal to said second node of said photo conversion device.

53. An imaging pixel comprising:
a photo conversion device for producing an electrical signal at a first node thereof in response to incident light energy;
a biasing transistor operating at sub-threshold level and connected to a second node of said photo conversion device, for maintaining a zero-bias across said photo conversion device;
an NMOS source follower transistor connected to said first node of said photo conversion device, for reading a signal from said photo conversion device;
an NMOS selection transistor connected to said NMOS source follower transistor, for selecting said imaging pixel;
an electrical circuit for receiving said electrical signal at said first node and producing a pixel output signal therefrom; and
a circuit path for providing said output signal to a second node of said photo conversion device.

* * * * *